June 22, 1965 G. R. SMYTHE 3,191,075
MULTISTAGE AMPLIFIER COUPLED TO AN INDUCTIVE LOAD
Filed Nov. 16, 1960
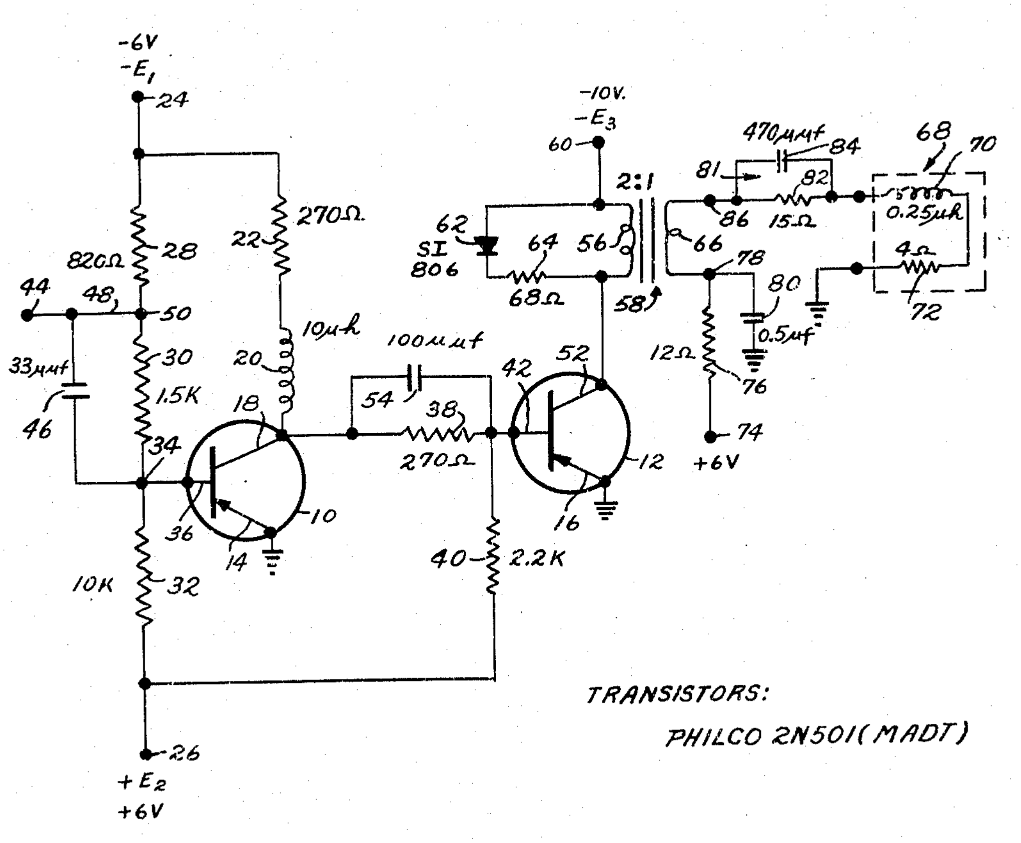
INVENTOR
GEORGE R. SMYTHE
BY Cushman, Darby & Cushman
ATTORNEYS 3,191,075
Patented June 22, 1965

3,191,075
MULTISTAGE AMPLIFIER COUPLED TO AN INDUCTIVE LOAD

George R. Smythe, St. Paul, Minn., assignor to Sperry Rand Corporation, New York, N.Y., a corporation of Delaware Filed Nov. 16, 1960, Ser. No. 69,688
8 Claims. (Cl. 307—104)

This invention relates to a multistage amplifier, and particularly to such an amplifier for providing a source of high current, fast rising power pulses with greater power output than has heretofore been possible, to an inductive load such as a drive line in a magnetic core memory system.

In one feature of the invention, two amplifying transistorized stages are employed, with the first stage being normally highly conductive while the second stage is cutoff, and vice versa when the first stage is cutoff by an input pulse. The first stage has an inductor serially connected to the collector of the transistor in that stage, while the second stage transistor has its base resistively coupled to the collector of the first stage and also to a source of biasing voltage. When the first stage is cutoff by the application of an input pulse, the relatively high current previously flowing in the inductor cannot change instantaneously, so is drawn mainly through the base-emitter circuit of the second transistor stage. This causes the second transistor to turn on very rapidly with a high bandwidth characteristic but low current gain. As the current in the inductor decreases, the second stage transistor reaches a steady-state operation in which the bandwidth is considerably decreased but the gain of the second state transistor is greatly increased. In order to cause the second transistor stage to turn off as rapidly as possible, the resistor between the collector of the first transistor and the base of the second transistor is parallelled by a condenser, so that when the first transistor is made reconductive, its relatively large amount of collector current can be immediately drawn from the energy stored in that condenser, the then relatively low current in the collector inductor being unable to instantaneously provide the required amount of collector current for the first stage.

As another feature of the invention, a transformer primary winding is serially connected in the collector circuit of the second transistor stage to provide via its secondary winding a low impedance voltage source from which fast rise time load current pulses may be derived for an inductive load. With that load being serially coupled to the secondary winding by a parallel RC circuit, the maximum amount of power is transferred from the secondary winding to the inductive load since that load then appears to that winding as a pure resistance.

While the second stage transistor is conductive, current is being drawn through the primary winding of the above mentioned transformer. Whenever the second transistor is made non-conductive, a voltage of self-induction is generated in the primary winding in a direction so as to be additive to the D.C. operating potential connected to the collector. The sum of these voltages is so great as to potentially damage the collector of the second transistor. Another feature of this invention, then, is to prevent the possibility of any such damage by damping means connected across the primary winding to cause the self-induced voltage to be rapidly damped out.

Objects of this invention lie in providing equipment incorporating the features above mentioned. Still other objects and advantages of this invention will be apparent by reference to the appended claims and the following description of the drawing.

The multistage pulse power amplifier shown in the drawing includes transistors 10 and 12 as the active elements. The emitter electrodes 14 and 16, respectively, of these transistors are both grounded so as to be referenced to zero voltage. As illustrated by the inwardly pointing arrow on each of the emitter electrodes, transistors 10 and 12 are both of the PNP type, though they may be of the NPN type if desired.

Transistor 10 is normally held in a conductive state, near saturation, so as to conduct a relatively large amount of current from ground through emitter 14 to collector 18, thence through inductor 20, resistor 22, to terminal 24 at which a negative potential $-E_1$, for example of $-6$ volts, is applied. Transistor 10 is normally maintained highly conductive by the voltage divider system between terminals 24 and 26, there being a positive voltage $+E_2$, for example of $+6$ volts, connected to terminal 26, with resistors 28, 30 and 32 making up the voltage divider. With the voltages mentioned and the illustrated values of resistances, the normal potential at junction 34 may be in the order of $-4$ volts, whereby base electrode 36 is held more negative than the grounded emitter electrode 14.

Inductor 20 is not only serially connected with collector 18 and emitter 14, but is also serially connected via the D.C. coupling resistor 38 and the base biasing resistor 40 to the $+E_2$ voltage at terminal 26. With transistor 10 conducting virtually at full saturation, the total current through inductor 20 includes the emitter-collector current of the transistor and an additional amount of current which is drawn from the $+E_2$ source through resistors 40 and 38. As an example, the relatively high amount of collector current may be approximately 20 milliamps, and the additional current drawn from terminal 26 through resistors 40 and 38 may be approximately 2.5 milliamps. With approximately 2.5 milliamps of current being drawn through resistor 40, the base electrode 42 of transistor 12 is held, while transistor 10 is heavily conductive, at approximately $+0.6$ volt, a potential which is above the ground potential for emitter 16, thereby making transistor 12 non-conductive at that time.

In order to make transistor 10 non-conductive, a square wave pulse is applied to input terminal 44 and from there to the voltage divider system, as to junction 34 via condenser 46 and directly by line 48 to junction 50, so that base electrode 36 quickly raises in potential to a point sufficiently positive relative to emitter electrode 14. This cuts off transistor 10, but since the current in inductor 20 cannot change instantaneously as is well known, the 22.5 milliamps previously flowing through inductor 20 maintains itself for the instant of the rise time of the input pulse applied to terminal 44 and base 36. For the instant that the inductor current remains the same, it is drawn from two sources: (1) from the bias circuit for transistor 12, i.e., via resistor 40 from the $+E_2$ voltage source, and (2) from ground through the emitter 16 and base 42 circuit. The current through resistor 40 increases slightly from what it was (approximately 2.5 milliamps) to approximately 3 milliamps which places the base 42 at approximately $-0.3$ volt whereby transistor 12 is conductive, with the remainder (approximately 19.5 milliamps) of conductor current being drawn through the emitter-base circuit of transsitor 12. It should be noted that for the instant during which the previously existing amount of current through inductor 20 is maintained, that the main portion of that current is not derived from the $+E_2$ source, but is drawn through the emitter-base circuit of transistor 12, and this is during the initial rise time of the input pulse to terminal 44. As a result, transistor 12 is turned on as fast as possible. Of course, the current through inductor 20 does drop off immediately after the initial rise time. However, it is only during the initial rise time that it is necessary for transistor 12 to conduct as fast as possible, and it is only during this rise time that inductor 20 acts as if it were a constant current source fixing the base drive for transistor 12 at a constant current.

As is well known, one of the figures of merit of a transistor is its gain bandwidth product GB. Bandwidth itself is indicative of the frequency response of a transistor, and the gain therefor refers to the current gain of that transistor in the configuration in which it is connected. For the illustrated transistors, it is apparent that they are connected in the grounded-emitter configuration. Consideration relative to the GB product, is as to transistor 12. The leading edge of the signal which turns on transistor 12 can be considered the highest frequency input. In order to obtain a fast rising output pulse, the main initial concern is to have a high bandwidth, i.e., good frequency response, so that transistor 12 responds rapidly. But in order to achieve this, some of the gain has to be sacrificed initially. That is, though transistor 12 is capable of operating at a higher gain, at its turn on time, it is operated at a lower gain in order to obtain a relatively high frequency response. However, once the transistor is turned on, the input signal to base 42 reaches a relatively constant amplitude, i.e., the relatively flat top of the input pulse, so therefore the operating bandwith of the transistor then can be reduced so that the operational current gain of the transistor can be increased. In other words, the base current of transistor 12 can be allowed to drop because the consequent increased gain will compensate for the drop of the input base current to cause a constant GB product.

Assume for example, that transistor 12 has a GB of 90 megacycles. At turn on time, a bandwith of 30 megacycles will allow transistor 12 to respond rapidly to the input pulse. This therefore leaves a gain of approximately only 3, and in order to get a desired 60 milliamp pulse output from the collector 52, a current of approximately 20 mils must be drawn through the base-emitter circuit of transistor 12. This, as above indicated, is approximately what is accomplished during the instant that inductor 20 maintains its current after transistor 10 is cut off by an input pulse to terminal 44. When the signal to base 42 reaches a substantially constant value, the operational bandwidth of transistor 12 can be sacrificed because then the transistor is operating at virtually D.C. conditions so that the current in base 42 is decreased to a comparatively smaller amount so that the transistor operates at about a gain of 30. Therefore, in order to obtain the desired pulse output magnitude from collector 52, the base need be supplied with approximately 2 milliamps to retain the 60 mil output amplitude. The collector current of transistor 12 is fixed by its load resistance and collector supply voltage. One may therefore adjust the current gain of transistor 12 by adjusting the current in inductor 20, and thereby adjust the bandwith of the second stage to give the required rise time. The time constant of inductor 20 and the circuit resistance associated therewith must be short enough so that a steady-state operation can be reached during the duration of the input pulse to terminal 44; otherwise, the current gain and hence the rise time associated with the output pulse from connector 52 will be pulse-rate sensitive. This avoids the necessity of varying any operating bias if the input pulse repetition rate changes.

From the foregoing, it should be apparent that the output signal from collector 52 has a very rapid rise time. It is also desired to cause the puulse from collector 52 to have a rapid fall time. This is accomplished by paralleling resistor 38 with condenser 54. That is, when transistor 10 is made reconductive by the cessation or sufficient subsiding of the input pulse to terminal 44, the relatively small amount of current that was being drawn through inductor 20 during the latter portion of the input pulse time cannot increase instantaneously, so the current for collector 18 is supplied for the moment primarily from the energy that was stored in condenser 54 during the off time of transistor 10. This rapidly increases the voltage on base 42, so that transistor 12 is turned off as soon as possible.

As may be noted in the drawing, collector 52 of transistor 12 is coupled by primary winding 56 of transformer 58 to a negative supply voltage $-E_3$, for example of $-10$ volts, connected to terminal 60. During the interval that transistor 12 is conducting current in the manner previously described, current flows through the inductive element 56. As soon as conduction in transistor 12 stops then, there is a voltage of self-induction developed across the primary winding 56 in such a polarity as to be additive to the $-E_3$ voltage. The self-induction voltage is approximately equal to the $-E_3$ voltage so as to make a total voltage, for example of approximately $-20$ volts, which is, or possibly may be, sufficient to damage collector 52. To prevent any such potential damage, impedance means which includes a unidirectional current conducting device, is connected across the primary winding 56. In particular, such impedance means includes a series combination of a diode 62 and resistor 64. It is to be understood that diode 62 is poled in the proper direction to damp out quite rapidly the flyback or backswing voltage of self-induction of primary winding 56, so that the collector junction of transistor 12 is not destroyed by the application of too large a reverse voltage. Transformer 58 has its primary winding 56 effectively connected to a low impedance voltage generator comprising transistor 12, from which current pulses may be applied by the secondary winding 66 to an inductive load 68 which may comprise a drive line of a magnetic core system for example. In such a case, the drive line may be represented by an inductance 70 in series with resistor 72. Normally, it is desirable to apply a positive bias, for example +6 volts, via terminal 74 and resistor 76 to the bottom terminal 78 of secondary winding 66, to maintain the drive line 68 positive in absence of a negative pulse drive from secondary winding 66. Preferably, bypass condenser 80 is connected from terminal 78 to ground, and the primary to secondary turns ratio of transformer 58 is 2:1.

As will be apparent from the drawing, the drive line load 68 is coupled across secondary winding 66. It has been discovered by the present applicant, that the maximum amount of power may be transferred from winding 66 to the drive line 68, if a parallel RC circuit 81 is serially connected therebetween. This circuit comprises resistor 82 and condenser 84, which by their addition make the load appear to be one section of an artificial transmission line with added series resistance. Under this condition, the impedance looking into terminals 78 and 85 from the secondary 66, is purely resistive and is equal to the sum of the values of resistors 72 and 82 or $E_{70}/i_{70}$. The value of resistor 82 is equal to the square root of the quotient determined by dividing the inductance value of inductor 70 by the capacitance of condenser 84, with the network cutoff frequency above which the resistance only, impedance condition no longer applies, being the reciprocal of the resultant of pi times the square root of the product of the values of inductance 70 and condenser 84. With transformer 58 and RC circuit 81 then, one is able to provide fast rise time pulses of load current to an inductive load from a low impedance voltage source.

Representative values and types of components are shown on the drawing, but limitation thereto is not intended.

Thus it is apparent that this invention successfully achieves the various objects and advantages herein set forth.

Modifications of this invention not described herein will become apparent to those of ordinary skill in the art after reading this disclosure. Therefore, it is intended that the matter contained in the foregoing description and the accompanying drawing be interpreted as illustrative and not limitative, the scope of the invention being defined in the appended claims.

What is claimed is:

1. A multistage pulse power amplifier comprising: first and second like conductivity type transistors each with emitter, collector, and base electrodes, means for receiving a predetermined referenced potential coupled to each of said emitter electrodes, said second transistor being connected in a predetermined circuit configuration to effect a predetermined current gain G and having a bandwidth B indicative of the frequency response of the second transistor, the gain band-width product GB for said second transistor being constant at all instants of conducting time of the second transistor whereby any variation in one of G and B is compensated by a variation in the other thereof to maintain said GB product constant, means coupled to said base of said first transistor for receiving an input pulse to cause said first transistor collector to conduct current in the absence of said input pulse but not in the presence thereof, load means coupled to the collector electrode of said second transistor, and compensating means for causing said second transistor to exhibit a substantially increased bandwith B at a sacrifice of current gain G during the first instant that said first transistor stops conducting and to exhibit during the remaining time said first transistor is non-conducting a substantially increased current gain G and a substantially decreased bandwidth B to therefore effect an instantaneous rise in load current during said sacrifice of said gain and subsequent amplification therein during said substantially increased gain, said compensating means including an inductor having one terminal serially connected with the said first transistor collector electrode and a second terminal of said inductor serially coupled through resistive means to the input means, so that said collector current passes through the inductor while the first transistor is conducting, and means coupled to the base and emitter electrodes of the said second transistor, including a resistor connected between the base electrode of said second transistor and the junction of said one terminal of the inductor and said first transistor collector electrode, for biasing said second transistor to cutoff, and for supplying an additional current through said inductor via said resistor while said first transistor is conducting, said inductor current momentarily remaining the same due to the inertia of said inductor following receipt of said input pulse, passing totally through said resistor and in substantial part through the second transistor base-emitter circuit to effect said substantially increased bandwidth B obtained during said first instant that said first transistor stops conducting.

2. A multistage pulse power amplifier comprising first and second like conductivity type transistors each with emitter, collector and base electrodes, means for receiving a predetermined reference voltage coupled to each of said emitter electrodes, means coupled to said base of the first transistor for receiving an input pulse to cause said first transistor to conduct current in the absence of said input pulse but not in the presence thereof, and interstage coupling means for causing said second transistor to start conducting as soon as said first transistor becomes non-conductive of said current and to remain conducting while said first transistor is so non-conductive, said interstage coupling means including, an inductor having one terminal thereof serially connected with the first transistor collector electrode and the other end of said inductor serially coupled through resistive means to said input means, so that said collector current passes through the inductor while the first transistor is conducting, means coupled to the base and emitter electrodes of the second transistor, including a resistor connected between the base electrode of said second transistor and the junction of said inductor and first transistor collector electrode, for biasing said second transistor to cutoff and for supplying an additional current through said inductor via said resistor while the first transistor is conducting, said inductor current, being unable to change instantaneously when the first transistor is cutoff in response to an input pulse passing totally through said resistor to turn on said second transistor to cause the second transistor to exhibit a substantially increased bandwidth response at a sacrifice of current gain at turn-on, while thereafter during the continued existence of the input pulse the current through said inductor decreases substantially to effect in the second transistor a decreased bandwidth and a substantially increased current gain, and load means coupled to the collector of said second transistor.

3. An amplifier as in claim 2 and further including a condenser paralleling said resistor for reducing the time required to turn off said second transistor after said input pulse subsides sufficiently to make the first transistor re-conductive.

4. An amplifier as in claim 2 wherein said load means includes a transformer having one terminal of a primary winding serially connected to the second transistor collector electrode, means for receiving a predetermined voltage coupled to a second terminal of said primary winding, and a secondary winding coupled across a series inductance-resistance load, said secondary winding being coupled to said load by a parallel RC circuit which is in series with both said load and secondary winding and which makes said load and RC circuit look purely resistive to said secondary winding.

5. An amplifier as in claim 2 wherein said load means includes a transformer having one terminal of a primary winding serially connected to the said second transistor collector electrode, means for receiving a predetermined voltage coupled to a second terminal of said primary winding, impedance means including unidirectional current conducting means coupled across said primary winding and poled in a direction for rapidly damping out the voltage of self-induction occurring across said winding when the second transistor is returned to cutoff upon cessation of said input pulse to prevent damaging the collector electrode of the second transistor by said voltage.

6. An amplifier as in claim 5 wherein said transformer has a secondary winding and said load means further includes a series inductance-resistance load coupled across the secondary winding, there being a parallel RC circuit serially coupling said secondary winding to said load for effecting maximum power transfer to said load.

7. An amplifier as in claim 5 wherein said impedance means includes a resistor and serial connected diode.

8. An amplifier for supplying fast rise time, high current pulses with maximum power transfer to a series inductance-resistance load comprising first and second PNP type amplifying transistors each with an emitter, collector and base, each of said emitters being connected to a zero potential level, a first source of negative potential, a first resistor and inductor serially connected between said source and first transistor collector, a source of positive potential, a voltage divider connected between said sources and to said first transistor base to cause the first transistor to be normally substantially fully conductive so as to pass the collector current through said inductor, a second resistor coupled between said first collector and the second transistor base, a condenser in parallel with said second resistor, a third resistor coupling said second transistor base to said positive potential source to cause the second transistor to be biased off while the first transistor is conductive and to supply during that time an additional current via said second resistor and through said inductor, input signal means coupled to said voltage divider for providing to said first base an input signal to cutoff the first transistor whereupon since the amount of current in said inductor cannot change instantaneously the total amount of current therein, which for an instant still equals the sum of said collector current and said additional current, flows through said second resistor with a greater amount than the amount of said additional current going through said third resistor and the remainder through said second base and second emitter to cause the second transistor to turn on quickly to provide a fast rising current flow from the emitter to collector of said second transistor, a second source of negative potential, a current step-up transformer having a primary and secondary with the primary serially coupling the second transistor collector to the said second source and transferring to said secondary the said fast rising current flow of the second transistor with increased amplitude, the said condenser being effective to increase the speed of turn off of the second transistor when the first transistor becomes re-conductive due to subsiding of said input signal to cause said amplified fast rising current flow to become a pulse in said secondary, the turn off of the second transistor being effective to induce a voltage in said primary additive to the potential of said second source with the total resultant potential being sufficient to damage the second collector, a series combination of a diode and fourth resistor coupled across said primary with the diode preventing application of said total potential to the second collector to prevent damage thereof, a series inductance-resistor load as aforesaid and coupled across said secondary, and a parallel RC circuit serially coupled between said secondary and load to make the load look purely resistive to the secondary.

References Cited by the Examiner

UNITED STATES PATENTS

| | | | |
|---|---|---|---|
| 2,849,626 | 8/58 | Klapp | 307—88.5 |
| 2,868,897 | 1/59 | Hamilton | 307—88.5 |
| 2,946,899 | 7/60 | Day | 307—88.5 |
| 2,963,592 | 12/60 | Graaf | 307—88.5 |
| 2,981,852 | 4/61 | McLean | 307—88.5 |
| 2,990,478 | 6/61 | Scarbrough | 307—88.5 |
| 2,991,429 | 7/61 | Force | 307—88.5 |
| 3,025,411 | 3/62 | Rumble | 307—88.5 |
| 3,056,046 | 9/62 | Morgan | 307—106 |
| 3,062,969 | 11/62 | Wilkerson | 307—88.5 |
| 3,075,085 | 1/63 | Helbig et al. | 307—88.5 |
| 3,076,106 | 1/63 | Douma | 307—106 |

LLOYD McCOLLUM, *Primary Examiner.*

ORIS L. RADER, MILTON O. HIRSHFIELD, *Examiners.*

UNITED STATES PATENT OFFICE

CERTIFICATE OF CORRECTION

Patent No. 3,191,075 June 22, 1965

George R. Smythe

It is hereby certified that error appears in the above numbered patent requiring correction and that the said Letters Patent should read as corrected below.

Column 2, line 63, for "conductor" read -- inductor --; line 64, for "transsitor" read -- transistor --; column 3, lines 28 and 57, for "bandwith", each occurrence, read -- bandwidth --; line 69, for "puulse" read -- pulse --; column 8, line 2, for "inductance-resistor" read -- inductance-resistance --.

Signed and sealed this 24th day of May 1966.

(SEAL)
Attest:

ERNEST W. SWIDER
Attesting Officer

EDWARD J. BRENNER
Commissioner of Patents